United States Patent
Blagojevic et al.

(10) Patent No.: US 10,393,848 B2
(45) Date of Patent: Aug. 27, 2019

(54) CALIBRATION TOOL FOR CALIBRATING A MAGNETIC SENSOR

(71) Applicant: SENIS AG, Zug (CH)

(72) Inventors: Marjan Blagojevic, Nis (RS); Radivoje Popovic, Zug (CH); Sasa Spasic, Baar (CH)

(73) Assignee: SENIS AG (CH)

( * ) Notice: Subject to any disclaimer, the term of this patent is extended or adjusted under 35 U.S.C. 154(b) by 157 days.

(21) Appl. No.: 15/708,110

(22) Filed: Sep. 18, 2017

(65) Prior Publication Data

US 2018/0120406 A1     May 3, 2018

(30) Foreign Application Priority Data

Oct. 31, 2016 (EP) .................................. 16196608

(51) Int. Cl.
| | | |
|---|---|---|
| *G01R 35/00* | (2006.01) | |
| *G01R 33/00* | (2006.01) | |
| *H01F 7/02* | (2006.01) | |
| *G01R 33/02* | (2006.01) | |

(52) U.S. Cl.
CPC ....... *G01R 35/005* (2013.01); *G01R 33/0017* (2013.01); *H01F 7/0278* (2013.01); *G01R 33/0206* (2013.01)

(58) Field of Classification Search
CPC ............ G01R 33/0017; G01R 33/0035; H01F 7/0278
USPC ........................................................ 324/202
See application file for complete search history.

(56) References Cited

U.S. PATENT DOCUMENTS

| | | | | |
|---|---|---|---|---|
| 3,248,645 A | * | 4/1966 | Gilbert ................... | G01R 33/07 324/251 |
| 4,634,961 A | * | 1/1987 | Popovic .................. | H01L 43/04 257/421 |
| 5,500,589 A | * | 3/1996 | Sumcad ................. | G01R 33/00 324/202 |
| 7,719,261 B2 | * | 5/2010 | Geck ...................... | G01C 17/38 324/202 |
| 8,963,538 B2 | * | 2/2015 | Jones ................. | G01R 33/0035 324/202 |

(Continued)

FOREIGN PATENT DOCUMENTS

| | | |
|---|---|---|
| EP | 495486 A2 | 7/1992 |
| WO | 2004003585 A1 | 1/2004 |

*Primary Examiner* — Patrick Assouad
*Assistant Examiner* — Demetrius R Pretlow
(74) *Attorney, Agent, or Firm* — CanaanLaw, P.C.; David B. Ritchie

(57) ABSTRACT

A calibration tool for calibrating a magnetic sensor comprises a cuboid-shaped housing and one or more permanent magnets. The housing is configured to provide six alignment planes. The alignment planes lying opposite to each other extend parallel to each other and the alignment planes lying adjacent to each other include an angle of 90°. The housing has one or more holes allowing to position a magnetic sensor in a working volume located in the center of the housing. The housing may have six sidewalls. One or more of the sidewalls may include one or more adjustable element protruding from the respective sidewall. The adjustable elements may be screws. Permanent magnets of different materials having different temperature coefficients may be used to eliminate the temperature dependence of the magnetic field in the working volume.

20 Claims, 7 Drawing Sheets

(56) References Cited

U.S. PATENT DOCUMENTS

| | | | |
|---|---|---|---|
| 2006/0164073 A1* | 7/2006 | Bergsma | G01R 33/0206 324/202 |
| 2009/0128138 A1* | 5/2009 | Cuevas | G01V 3/083 324/207.21 |
| 2009/0273339 A1* | 11/2009 | Branson | G01V 13/00 324/202 |
| 2010/0007338 A1* | 1/2010 | Schultz | G01R 33/072 324/202 |
| 2012/0210562 A1* | 8/2012 | Jones | G01R 33/0035 29/593 |
| 2013/0038321 A1* | 2/2013 | Suzuki | G01R 35/00 324/224 |
| 2014/0333298 A1* | 11/2014 | Heberle | G01R 33/0017 324/228 |
| 2015/0145625 A1 | 5/2015 | Fukasawa et al. | |
| 2015/0160326 A1* | 6/2015 | Schutzmann | G07D 7/04 324/202 |
| 2016/0011277 A1* | 1/2016 | Chen | G01R 33/0023 324/202 |
| 2016/0069715 A1* | 3/2016 | Sinz | G01R 33/0035 198/619 |
| 2017/0067980 A1* | 3/2017 | Thiagarajan | G01R 33/093 |
| 2017/0122737 A1* | 5/2017 | Barladeanu | G01C 17/38 |
| 2018/0329012 A1* | 11/2018 | Ueyama | G01R 33/02 |
| 2019/0041473 A1* | 2/2019 | Tanabe | G01B 7/003 |

* cited by examiner

CALIBRATION TOOL FOR CALIBRATING A MAGNETIC SENSOR

PRIORITY CLAIM

Applicant hereby claims foreign priority under 35 U.S.C § 119 from European Patent Application No. 16196608.0 filed on Oct. 31, 2016, the disclosure of which is herein incorporated by reference.

FIELD OF THE INVENTION

The invention concerns a calibration tool for calibrating magnetic sensors.

BACKGROUND OF THE INVENTION

The sensitivity of a magnetic sensor is defined by a sensitivity vector S. The sensitivity vector S needs to be calibrated in order to achieve the parallelism of its components $S_x$, $S_y$, and $S_z$ with the x, y and z axis of a reference coordinate system in which a magnetic field to be measured is present. Especially for a multi-axis magnetic field sensor, the calibration of the mutual orthogonality between the sensitivity vectors of individual sensor elements is required to achieve high accurate measurements of the magnetic field. The calibration of the sensitivity vector S requires a magnetic field source which produces a stable homogeneous magnetic field having a constant field intensity, i.e. a reference magnetic field source producing a defined magnetic field vector B. In order to fulfill this requirement, commonly a set-up with Helmholtz coils or electromagnets is used as magnetic field source.

Calibration also requires that the direction of the magnetic field vector B is aligned parallel to one of the axis of the sensor's coordinate system. However, perfect parallelism is very difficult to achieve in practice, mostly resulting in insufficient accuracy of the calibration.

DISCLOSURE OF THE INVENTION

The object of the invention is to provide a calibration tool for calibrating a magnetic sensor overcoming the above mentioned drawback.

SHORT DESCRIPTION OF THE INVENTION

A calibration tool for calibrating a magnetic sensor comprises a cuboid-shaped housing and one or more permanent magnets positioned in the housing. The housing is configured to provide six alignment planes. The alignment planes extend either parallel or at an angle of 90° with respect to each other. The one or more permanent magnets provide in a working volume a homogeneous magnetic field that has a constant field intensity. The housing has one or more holes allowing to position a magnetic sensor in the working volume. The one or more permanent magnets may also comprise such holes allowing to position the magnetic sensor in the working volume.

The one or more permanent magnets may comprise, for example, a predetermined number of two or four permanent magnets, namely a first permanent magnet and a second permanent magnet or a first permanent magnet, a second permanent magnet, a third permanent magnet and a fourth permanent magnet.

In a first embodiment, the calibration tool comprises a predetermined number of two permanent magnets, wherein the two permanent magnets have a flat shape,
the two permanent magnets have a same magnetization direction,
the two permanent magnets are arranged along an axis and positioned in the housing, and
the two permanent magnets provide in a working volume a homogeneous magnetic field that has a constant field intensity.

In a second embodiment, the calibration tool comprises a predetermined number of four permanent magnets, the four permanent magnets being a first permanent magnet, a second permanent magnet, a third permanent magnet and a fourth permanent magnet, wherein the four permanent magnets have a flat shape,
the four permanent magnets are arranged along an axis and positioned in the housing,
the first permanent magnet and the second permanent magnet form a first pair of permanent magnets,
the third permanent magnet and the fourth permanent magnet are positioned outside the first pair of permanent magnets,
the first permanent magnet and the second permanent magnet have a same, first magnetization direction in order to provide in a working volume a homogeneous magnetic field that has a constant field intensity,
the third permanent magnet and the fourth permanent magnet have a same, second magnetization direction in order to provide in the working volume an additional homogeneous magnetic field that has a constant field intensity and points in a second direction,
the first permanent magnet and the second permanent magnet are made of a same material having a first temperature coefficient of the magnetic field,
the third permanent magnet and the fourth permanent magnet are made of a same material having a second temperature coefficient of the magnetic field which is different from the first temperature coefficient,
the first magnetization direction and the second magnetization direction are opposite to each other if the first and second temperature coefficient have the same sign and are the same if the first and second temperature coefficient have different signs,
the positions of the four permanent magnets along the axis are selected such that the temperature coefficient of the sum of the intensities of the magnetic field and the additional magnetic field in the working volume is zero.

In another embodiment, the one or more magnets may be hollow cylindrical, and given the case arranged concentrically and of different materials providing different temperature coefficients of their magnetic field, so that the temperature coefficient of the total magnetic field within the working volume is zero.

In yet another embodiment, the one or more permanent magnets may be arranged in a Halbach array.

A calibration setup for calibrating a magnetic sensor may include such a calibration tool, a reference member and a holder configured to hold the magnetic sensor. The reference member includes a reference wall for aligning the calibration tool and the holder is securable to the reference member in a fixed mechanical relationship.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

The calibration of a magnetic sensor usually requires that the magnetic sensor is exposed to a magnetic field $B_x$ pointing in the x-direction, then to a magnetic field $B_y$ pointing in the y-direction and then to a magnetic field $B_z$ pointing in the z-direction. The present invention concerns a calibration tool that can be used in a calibration setup to provide three magnetic field components $B_x$, $B_y$ and $B_z$ extending perfectly orthogonally to each other, with $|B_x|=|B_y|=|B_z|$.

Figure 1:
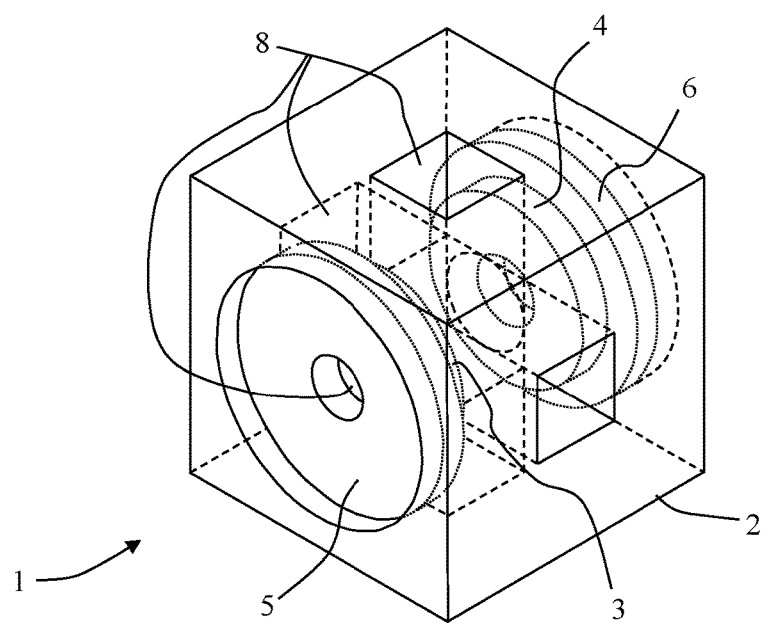
FIG. 1 shows a perspective view of a first embodiment of a calibration tool according to the invention.

FIG. 1 shows a perspective view of a first embodiment of a calibration tool 1 according to the invention. The calibration tool 1 comprises a housing 2, a first permanent magnet 3 and a second permanent magnet 4. Optionally, the calibration tool 1 further comprises (as shown) a third permanent magnet 5 and a fourth permanent magnet 6. For the sake of simplicity, the permanent magnets 3 to 6 are in the following referred to as magnets 3 to 6. The housing 2 is a cuboid-shaped housing with six sidewalls. Preferably, the cuboid-shaped housing 2 is a cube (as shown).

The magnets 3 to 6 have a flat shape and they also have a symmetry center. Preferably, they are disc-shaped. They may also be ring-shaped. The magnets 3 to 6 are positioned in the housing 2 along an axis 7 and affixed to the housing 2. The two inner magnets 4 and 5 are each located at a first distance $D_1$ from the geometric center of the housing 2 and, if present, the two outer magnets 3 and 6 are each located at a second distance $D_2$ from the geometric center.

The housing 2 has one or more holes 8 and the magnets 3 to 6 have corresponding holes allowing to position a magnetic sensor in a working volume extending around the geometric center of the cuboid-shaped housing 2. The holes 8 of the housing 2 and the holes of the magnets 3 to 6 form one or more passageways from the outside of the housing 2 to the working volume. The holes 8 of the housing 2 are arranged in the center of the sidewalls and the corresponding holes of the magnets 3 to 6 are arranged in the symmetry centers of the magnets 3 to 6. The axis 7 runs through the geometric center of the housing 2 and through the symmetry centers of the magnets 3 to 6. If the magnets 3 to 6 have a hole 8 in their center, the axis 7 runs through the holes 8.

Figure 2:
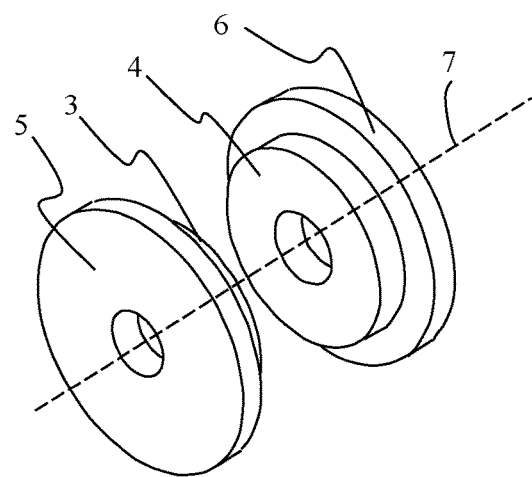
FIG. 2 shows a perspective view of four magnets positioned along an axis.
Figure 3:
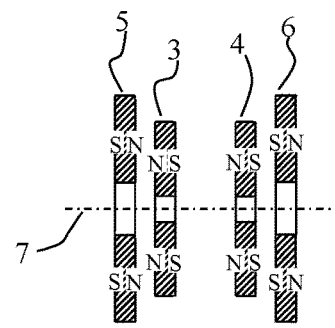
FIG. 3 illustrates the orientation and magnetization of the four magnets.

FIG. 2 shows a perspective view of the four magnets 3 to 6, and FIG. 3 illustrates the magnetizations of the magnets 3 to 6. The letter N denotes the North Pole and the letter S the South Pole of the magnets.

In a first embodiment, the calibration tool 1 only comprises the first magnet 3 and the second magnet 4. In a second embodiment, the calibration tool 1 comprises the four magnets 3 to 6 whereby the first magnet 3 and the second magnet 4 form a first, inner pair and the third magnet 5 and the fourth magnet 6 form a second, outer pair.

The magnets 3 and 4 are oriented in the same way, i.e. they have the same magnetization direction. Therefore, the magnets 3 and 4 produce magnetic fields which add up to a first magnetic field that points in a first direction and has a substantially constant field intensity $B_1$ within a volume that is at least the size of the working volume. The field intensity B of the magnetic field in the working volume is then $B=B_1$.

If present, the magnets 5 and 6 are oriented in the same way, i.e. they have the same magnetization direction which may be the same or opposite to the magnetization direction of the magnets 3 and 4. Therefore, the magnets 5 and 6 produce magnetic fields which add up to a second magnetic field that points in a second direction and has a substantially constant field intensity $B_2$ within a volume that is at least the size of the working volume. From the described arrangement of the magnets 3 to 6 it follows that the first and second direction are either the same or opposite to each other. In the working volume, the field intensity B of the total magnetic field is then $B=B_1+B_2$.

In the first embodiment having only the first magnet 3 and the second magnet 4, the magnets 3 and 4 produce in the working volume the first magnetic field that points substantially along the axis 7 and has the constant field intensity $B_1$. However, the field intensity $B_1$ depends on the temperature.

In the second embodiment with the four magnets 3 to 6, the magnets 3 and 4 are made of a first magnetic material which has a first temperature coefficient $k_1$. The magnets 5 and 6 are made of a second magnetic material which has a second temperature coefficient $k_2$. The first and second material are selected such that the second temperature coefficient $k_2$ is different from the first temperature coefficient $k_1$. Furthermore, the distances $D_1$ and $D_2$ are selected such that the temperature dependence of the field intensity $B=B_1+B_2$ vanishes.

The magnetization direction of the magnets 3 and 4 and the magnetization direction of the magnets 5 and 6 are opposite to each other if the first temperature coefficient $k_1$ and the second temperature coefficient $k_2$ have the same sign and they are the same if the first temperature coefficient $k_1$ and the second temperature coefficient $k_2$ have different signs. Nowadays, commercially available permanent magnets all have a negative temperature coefficient. Therefore, in this case, the two magnetization directions are opposite to each other, as shown in FIG. 3.

Figure 4:
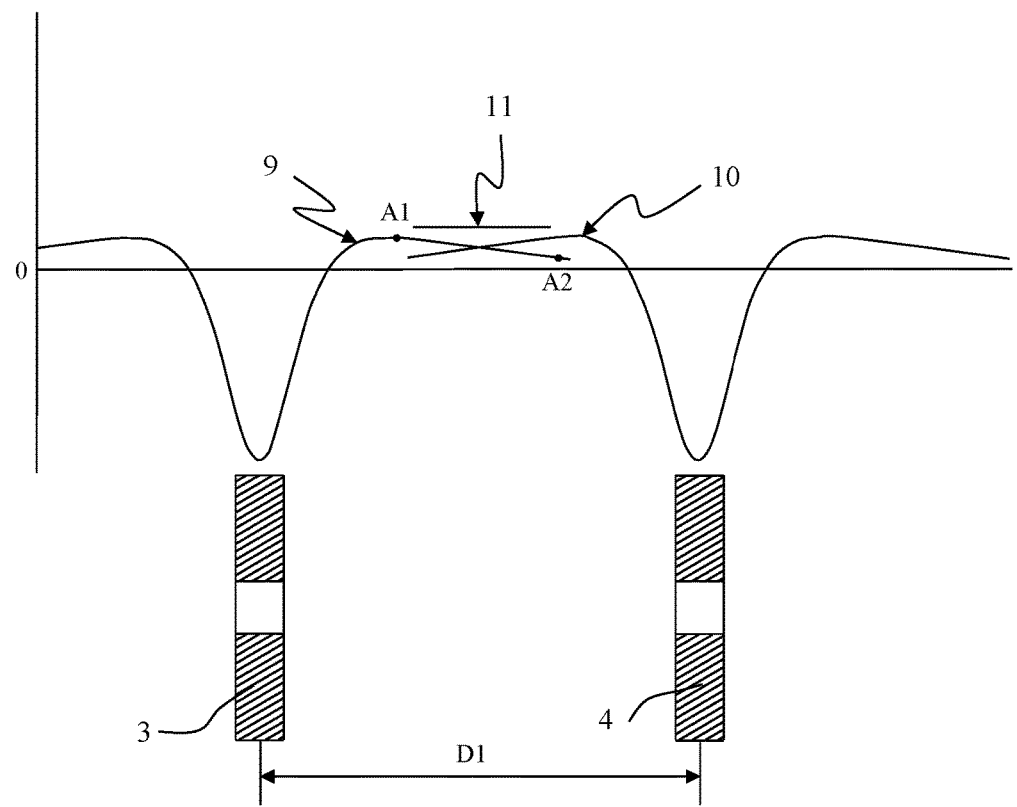
FIG. 4 shows a cross-section of a pair of magnets and the field intensity of the magnetic fields of the magnets along the axis.

FIG. 4 shows a cross-section of the magnets 3 and 4 and the field intensity of their magnetic fields along the axis 7. The magnets 3 and 4 are spaced apart by the distance $2D_1$. The field intensity of the magnetic field produced by the magnet 3 is shown with line 9, the field intensity of the magnetic field produced by the magnet 4 is shown with line 10. The field intensity of the sum of the two magnetic fields is shown with line 11. As can be seen, in a given range—here ranging from point A1 to point A2—the totally resulting magnetic field intensity is constant and has the value $B_1$.

Figure 5:
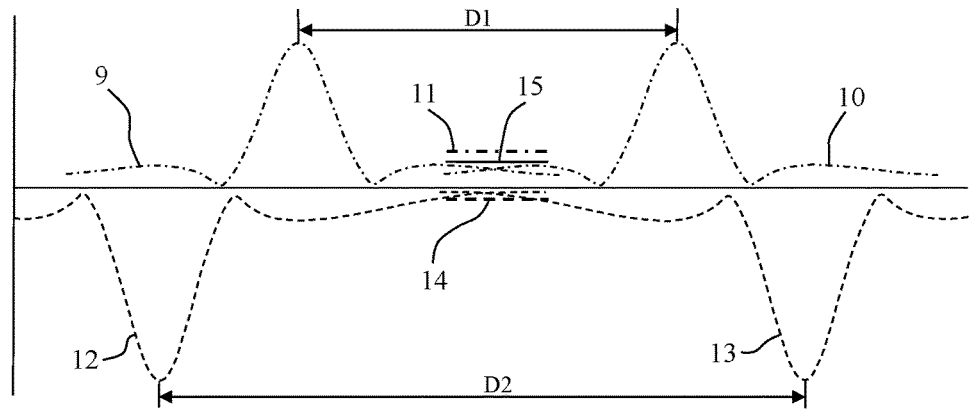
FIG. 5 shows the magnetic fields of four magnets positioned along the axis.

FIG. 5 shows the magnetic fields of the four magnets 3 to 6 along the axis 7 for the case that the first magnetic material and the second magnetic material both have a negative temperature coefficient, i.e. $k_1<0$ and $k_2<0$. The magnetization direction of the magnets 3 and 4 is opposite to the magnetization direction of the magnets 5 and 6. The field intensity of the magnetic fields produced by each of the four magnets 3 to 6 is shown by lines 9, 10, 12 and 13. The magnetic field produced by the magnets 5 and 6 has a constant field intensity $B_2$ in a second given range. So the field intensity B of the magnetic field produced by all four magnets 3 and 6 is constant in a given volume located around the geometric center of the housing 2. This volume must have at least the size of the working volume of the calibration tool 1. The field intensity $B_1$ of the magnetic field produced by the magnets 3 and 4 in the range is illustrated by line 11, the field intensity $B_2$ of the magnetic field produced by the magnets 5 and 6 in the second range is illustrated by line 14 and the field intensity B of the magnetic field produced by all four magnets 3 to 6 is illustrated by line 15.

The working volume extends around the center of the cuboid-shaped housing 2 and is located in the middle between the magnets 3 and 4 and also in the middle between the magnets 5 and 6. The field intensity $B_1$ of the magnetic field produced by the magnets 3 and 4 in the working volume is given by the equation:

$$B_1 = B_{r1} C_1 \quad (1)$$

while the field intensity $B_2$ of the magnetic field produced by the magnets 5 and 6 in the working volume is given by the equation:

$$B_2 = -B_{r2} C_2 \quad (2)$$

$C_1$ and $C_2$ each denote a geometric form factor which depends on the geometry of the respective magnet pair and on the distance $D_1$ or $D_2$, respectively. $B_{r1}$ denotes a temperature dependent factor of the magnetic field produced by the magnets 3 and 4 and $B_{r2}$ denotes a temperature dependent factor of the magnetic field produced by the magnets 5 and 6. The negative sign in equation (2) results from the fact that the magnetization direction of the magnets 5 and 6 is opposite to the magnetization direction of the magnets 3 and 4.

The temperature dependence of $B_{r1}$ and $B_{r2}$ is given by the equation:

$$B_{r,i}(T) = B_{r,i_{20}} \cdot (1 + k_i \cdot (T-20)) \text{ with } i=1,2 \quad (3)$$

where $B_{r,i_{20}}$ denotes the field intensity at 20° C., $k_i$ denotes the temperature coefficient of the field intensity and T denotes the temperature expressed in degrees Celsius.

The field intensity B of the magnetic field in the working volume of the calibration tool 1 shown in FIG. 1 is therefore given by the equation:

$$B = B_{r1} C_1 - B_{r2} C_2 = B_{r1_{20}} \cdot (1 + k_1(T-20)) \cdot C_1 - B_{r2_{20}} \cdot (1 + k_2 \cdot (T-20)) \quad (4)$$

The total magnetic field B is independent from the temperature T if the following equation is fulfilled:

$$B_{r1} k_1 C_1 = B_{r2} k_2 C_1 \quad (5)$$

$C_1$ depends on the distance between the magnets 3 and 4 which is $2D_1$ and $C_2$ depends on the distance between the magnets 5 and 6 which is $2D_2$. Therefore, the distances $D_1$ and $D_2$ are selected such that equation (5) is fulfilled.

The field intensity B of the magnetic field in the working volume of the calibration tool 1 may be calibrated for example with a NMR Teslameter.

Figure 6:
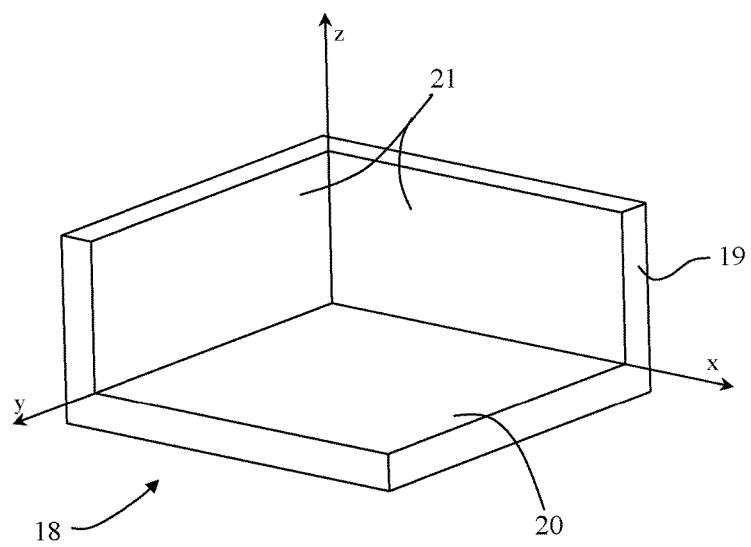
FIG. 6 shows a reference member.
Figure 7:
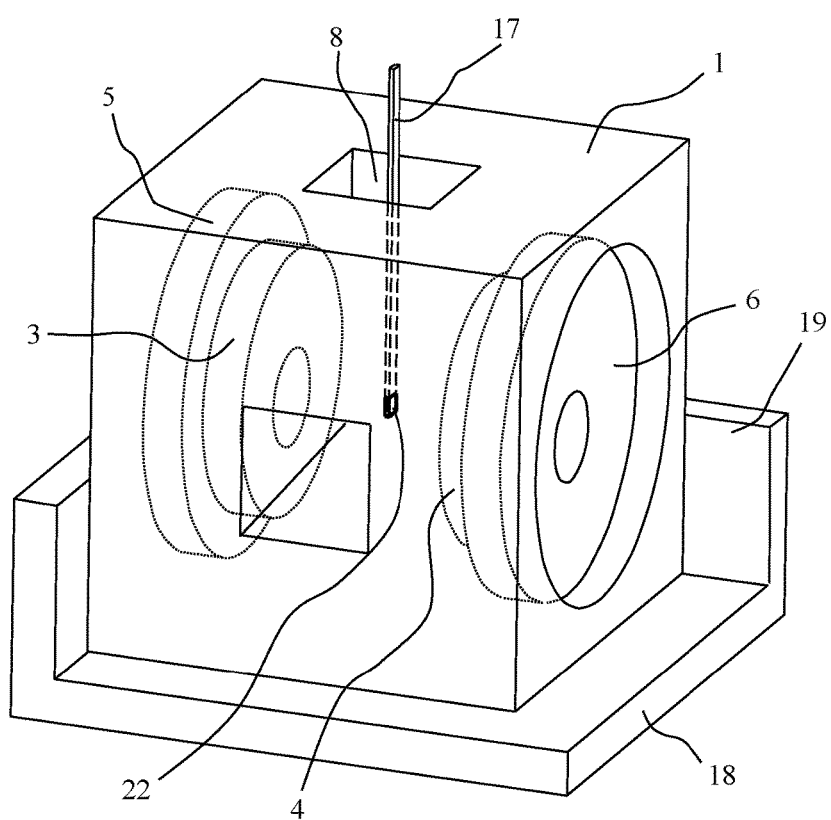
FIG. 7 illustrates the use of the calibration tool and the reference member.

The calibration tool 1 of the present invention can be used in a calibration setup to produce three magnetic field components $B_x$, $B_y$ and $B_z$ extending perfectly orthogonally to each other, with $|B_x|=|B_y|=|B_z|$, as illustrated in FIGS. 6 and 7. The calibration setup comprises the calibration tool 1, a holder 17 for the magnetic sensor and a reference member 18 for precisely aligning the calibration tool 1 with respect to the holder 17 and therefore with respect to the magnetic sensor. The holder 17 holds the magnetic sensor in a fixed position during the calibration procedure. The reference member 18 and the holder 17 of the magnetic sensor are in a fixed mechanical relationship, i.e. the holder 17 and the reference member 18 are fixed to a same base or apparatus, for example a magnetic field mapper. The reference member 18 includes a reference wall 19. The calibration tool 1 is placed at or on the reference member 18 such that one of its sidewalls (or alignment planes as shown further below, respectively) touches the reference wall 19. The holder 17 is configured and arranged in such a way that the holder 17 protrudes in one of the holes 8 of the calibration tool 1 so that the magnetic sensor is positioned within the working volume of the calibration tool 1.

The reference member 18 is preferably in the form of a 3D corner as shown in FIG. 6. The 3D corner has a floor 20 and two sidewalls 21 oriented at approximately 90° with respect to each other, one of its two sidewalls 21 is the reference wall 19. The 3D corner makes it easy to position the calibration tool 1 with any of its sidewalls (or alignment planes) touching the reference wall 19. When additionally another sidewall of the calibration tool 1 touches the other sidewall of the 3D corner, the working volume of the calibration tool 1 is always at the same position.

The calibration tool 1 and the reference member 18 make it possible—by 90° rotations of the calibration tool 1—to produce in the working volume a magnetic field pointing in anyone of the directions x, y, z, −x, −y and −z of a Cartesian coordinate system, i.e. to produce one of the magnetic field components $B_x$, $B_y$ and $B_z$ which extend perfectly orthogonally to each other as well as $-B_x$, $-B_y$ and $-B_z$ which are perfectly parallel to the respective component $B_x$, $B_y$ or $B_z$.

In the embodiment illustrated in FIG. 1, the housing 2 is a precision machined housing 2 with the six sidewalls extending parallel and orthogonal to each other to the desired degree of precision. During the calibration procedure, one of the sidewall of the calibration tool 1 touches the reference wall 19 of the reference member 18. Therefore, in this case the six sidewalls are alignment planes.

Figure 8:
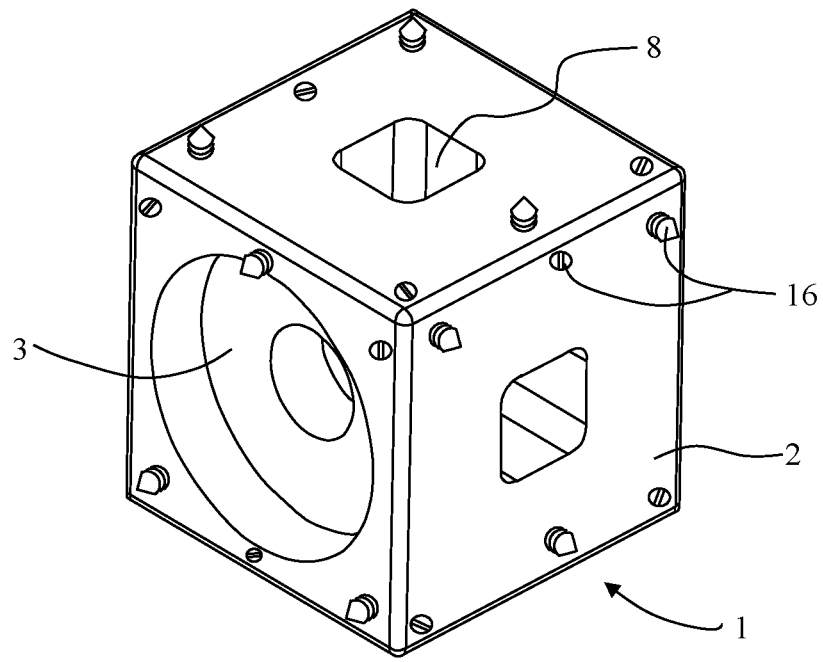
FIG. 8 shows a preferred embodiment of the calibration tool.

FIG. 8 illustrates a further embodiment of the calibration tool 1 in which the sidewalls of the housing 2 are not precision machined and cannot work as alignment planes. Each sidewall is provided with three threaded holes into which screws 16 are screwed. The ends of the screws 16 protrude out of the sidewalls, the ends may either be the heads or the tips of the screws 16. By screwing each of the screws 16 more or less into the corresponding threaded hole, the protrusion of the end of each of the screws 16 can be adjusted to an individual degree. The screws 16 are screwed into the threaded holes such that the ends of the screws 16 define six alignment planes which extend parallel or orthogonal, respectively, to each other. A reference orthogonality-calibrated magnetic sensor may be used to adjust the protrusion of the screws 16. The screws 16 of one sidewall after the other are adjusted so that four sidewalls extend parallel and two sidewalls extend orthogonally to the direction of the magnetic field in the working volume.

During the calibration of a magnetic sensor, the ends of the screws 16 of one of the sidewalls of the calibration tool 1 touch the reference wall 19 of the reference member 18 and thus perfectly align the calibration tool 1 at the reference wall 19 of the reference member 18.

This embodiment also allows the adjustment of the alignment planes such that the direction of the magnetic field produced by the magnets 3 and 4 or by the magnets 3 to 6, respectively, also runs parallel or orthogonal, respectively, to the alignment planes.

Figure 9:
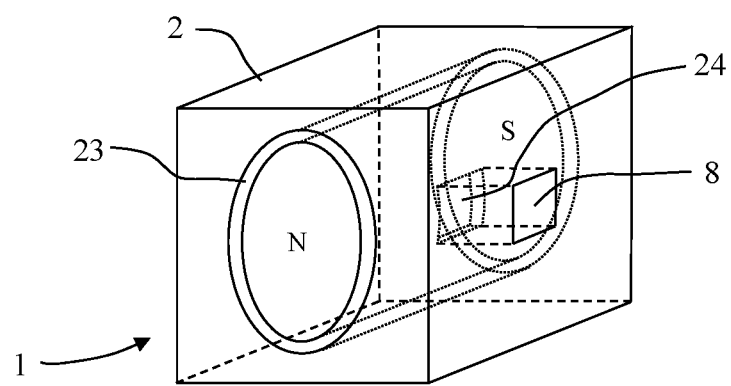
FIGS. 9 and 10 illustrate an embodiment of the calibration tool with cylindrical magnets.

FIG. 9 illustrates an embodiment of the calibration tool 1 with one magnet 23. The magnet 23 has the shape of a hollow cylinder. The housing 2 and the lateral surface of the magnet 23 have four pairs of holes 8 and 24 displaced by 90° from each other to allow the sensor 22 to access the working volume from outside of the tool 1. For the sake of clarity, only one of the four hole pairs is shown.

Figure 10:
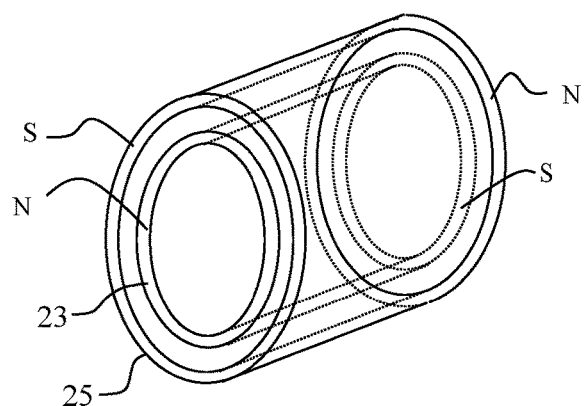

FIG. 10 illustrates an embodiment of the calibration tool 1 which has the hollow cylindrical magnet 23 and a second coaxially arranged hollow cylindrical magnet 25. The magnetization directions of the two magnets 23 and 25 are opposite to each other as can be seen from the placement of their North poles N and South poles S. The magnets 23 and 25 are made of different materials having different temperature coefficients and their size is selected such that the total magnetic field B produced in the working volume is temperature independent. For the sake of simplicity, the housing of the calibration tool 1 is not shown.

Figure 11:
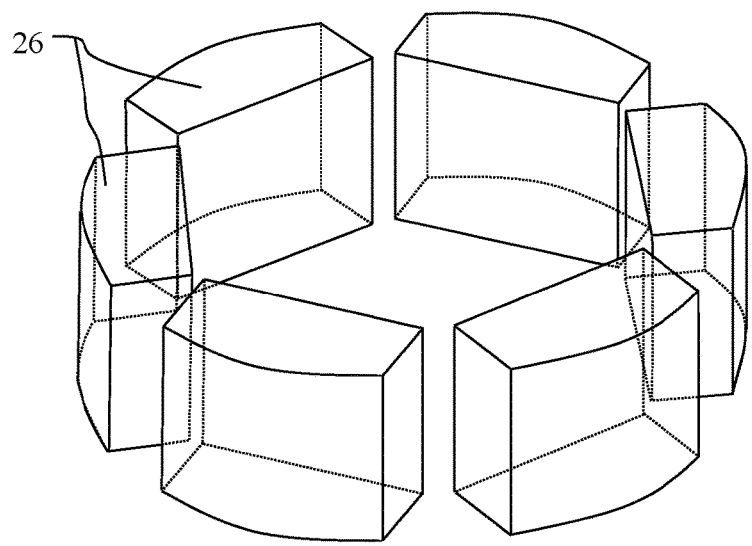
FIG. 11 illustrates an embodiment of the calibration tool with a Halbach array of magnets.

FIG. 11 illustrates an embodiment of the calibration tool 1 which has a predetermined number of magnets 26, for example a number of 4 or 6 or 8 or any other number of magnets 26 which are arranged to form a so-called Halbach array or Halbach cylinder. For the sake of simplicity, the housing of the calibration tool 1 is not shown. The magnets 26 may include holes or may be arranged at a predetermined distance from each other so that the working volume can be accessed either through the holes or through the gaps between the magnets 26. The independence of the total magnetic field B from the temperature T of this embodiment can be achieved either with a second coaxially arranged Halbach array of magnets which are made of a different material with a different temperature coefficient or by inserting additional magnets of a different material with a different temperature coefficient in the Halbach array in such a way that the temperature coefficient of the sum of the intensities of the magnetic field of the original Halbach array and the additional magnetic field of the additional magnets in the working volume is zero.

Calibration of a Magnetic Sensor

The magnetic sensor may be a one, two or three axis magnetic sensor, i.e. a magnetic sensor delivering one, two or three output signals corresponding to the magnetic field component(s) extending along the one, two or three axes. The calibration of a magnetic sensor needs a number of different calibrations:

1. Offset Calibration

To calibrate the offset, the magnetic sensor is placed in a zero gauss chamber. The temperature dependence of the offset is determined by heating or cooling the zero gauss chamber and by measuring the temperature and the output signal(s) of the magnetic sensor.

2. Calibration of the Temperature Dependence of the Sensitivity

To determine the temperature dependence of the sensitivity of the magnetic sensor, the magnetic sensor is placed in the working volume of the calibration tool 1. Then the temperature is changed by heating or cooling the magnetic sensor and the temperature and the output signal(s) of the magnetic sensor are measured at different temperatures.

3. Calibration of the Sensitivity Vector

The sensitivity vector calibration of the magnetic sensor may be made as follows:
1. The magnetic sensor 22 is fixed to the holder 17.
2. The calibration tool 1 is placed in a first rotational position on the reference member 18.
   The magnetic field points in one of the directions x, y, z, −x, −y and −z.
3. The output voltage(s) of the magnetic sensor 22 is/are measured.
4. The calibration tool 1 is removed and placed in another rotational position on the reference member 18 such that one of the alignment planes touches the reference wall 19.
   The magnetic field points now in another one of the directions x, y, z, −x, −y and −z.
5. The output voltage(s) of the magnetic sensor 22 is/are measured.

Figure 12:
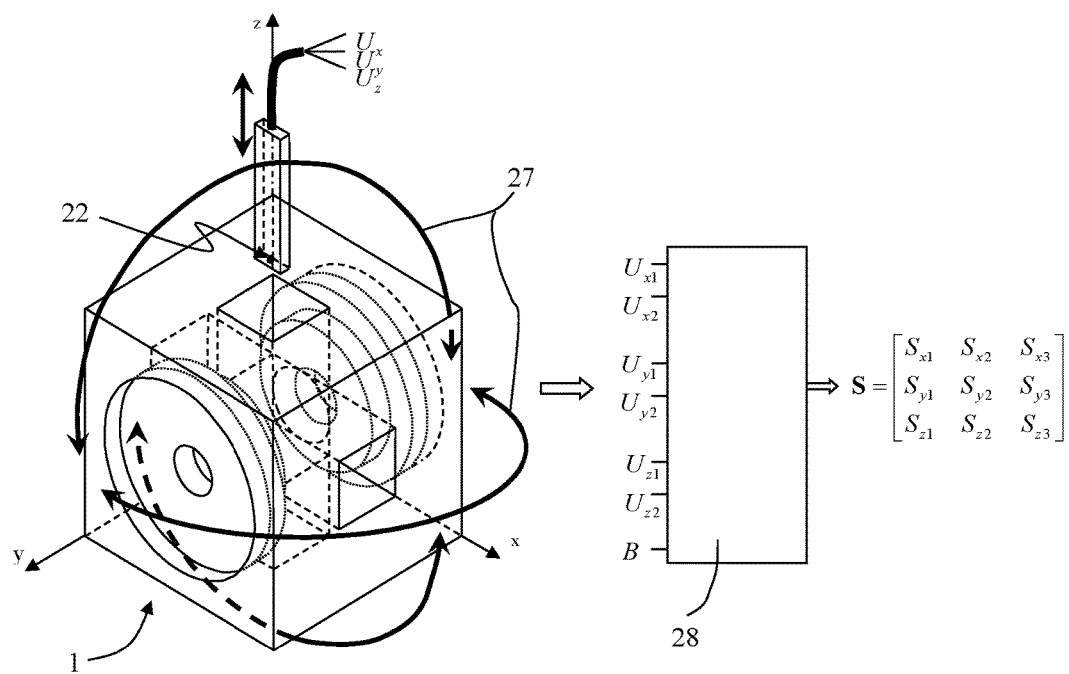
FIG. 12 illustrates the use of the calibration tool to calibrate a magnetic sensor.

Steps 4 and 5 are repeated for any further direction of the magnetic field that is necessary for the calibration. FIG. 12 illustrates this calibration procedure for a 3-axis magnetic sensor. The output signals of the magnetic sensor 22 in different rotational positions of the calibration tool 1 and the magnetic field intensity B in the working volume of the calibration tool 1 are fed to a calculation unit 28 which calculates the sensitivity matrix S. Arrows 27 illustrate how the calibration tool 1 is turned in step 4 from one position to another position.

The reference member 18 and the calibration tool 1 define a Cartesian coordinate system with three orthogonal axes x, y and z.

The result of the calibration is a sensitivity matrix S, which for a 1-axis magnetic sensor has the dimensions 1×3, i.e.:

$$S = \begin{bmatrix} S_{x1} \\ S_{y1} \\ S_{z1} \end{bmatrix},$$

for a 2-axis magnetic sensor has the dimension 2×3, i.e.:

$$S = \begin{bmatrix} S_{x1} & S_{x2} \\ S_{y1} & S_{y2} \\ S_{z1} & S_{z2} \end{bmatrix},$$

and for a 3-axis magnetic sensor has the dimension 3×3, i.e.:

$$S = \begin{bmatrix} S_{x1} & S_{x2} & S_{x3} \\ S_{y1} & S_{y2} & S_{y3} \\ S_{z1} & S_{z2} & S_{z3} \end{bmatrix}.$$

Once the calibration has been completed, the calibrated magnetic sensor can be used to determine one, two or three components of a magnetic field. With a 1-axis magnetic sensor, the sensor has to be positioned in three mutually orthogonal orientations and a measurement has to be taken in each of the three orientations OA, OB and OC. The components $B_x$, $B_y$ and $B_z$ of the magnetic field can then be calculated from a system of three equations. The system of equations depends on the chosen orientations, it might be for example:

$$U_A = S \cdot B = S_{x1} B_x + S_{y1} B_y + S_{z1} B_z$$

$$U_B = S \cdot B = S_{x1}B_y - S_{y1}B_z + S_{z1}B_y$$

$$U_C = S \cdot B = -S_{x1}B_y - S_{y1}B_z + S_{z1}B_x$$

where $U_A$ is the output signal of the 1-axis magnetic sensor in the first orientation OA, $U_B$ is the output signal of the 1-axis magnetic sensor in the second orientation OB and $U_C$ is the output signal of the 1-axis magnetic sensor in the third orientation OC. The quantities $S_{x1}$, $S_{y1}$ and $S_{z1}$ are known from the calibration.

With a 2-axis magnetic sensor two different orientations OA and OB of the magnetic sensor that are mutually orthogonal suffice to resolve the system of three equations with the three unknown components $B_x$, $B_y$ and $B_z$.

For instance, depending on the chosen orientations, the system of equations might be:

$$U_{xA} = S \cdot B = S_{x1}B_x + S_{y1}B_y + S_{z1}B_z$$

$$U_{yA} = S \cdot B = S_{x2}B_x + S_{y2}B_y + S_{z2}B_z$$

$$U_{xB} = S \cdot B = S_{x1}B_x - S_{y1}B_z + S_{z1}B_y$$

where $U_x$ is the output signal of the X channel (first axis of the 2-axis magnetic sensor) in the first orientation OA, $U_{yA}$ is the output signal of the Y channel (second axis of the 2-axis magnetic sensor) in the first orientation OA and $U_{xB}$ is the output voltage of the X channel (first axis of the 2-axis magnetic sensor) in the second orientation OB, and $S_{x1}$, $S_{z1}$, $S_{y1}$, $S_{y2}$, $S_{z1}$ and $S_{z2}$ are known from the calibration. When choosing other orientations, the system of three equations is different. From the above system of equations the magnetic field components $B_x$, $B_y$ and $B_z$ can be calculated.

With a 3-axis magnetic sensor, the magnetic field components $B_x$, $B_y$ and $B_z$ can be calculated $$\begin{bmatrix} B_x \\ B_y \\ B_z \end{bmatrix} = S^{-1} \cdot \begin{bmatrix} U_x \\ U_y \\ U_z \end{bmatrix}$$

where $U_x$, $U_y$ and $U_z$ are the output voltages of the 3-axis magnetic sensor and $S^{-1}$ denotes the inverse matrix of the matrix S.

The calibration setup of the present invention provides the following advantages:

The calibration tool 1 produces a homogeneous magnetic field having a predetermined field intensity in a predetermined working volume.

The calibration tool 1 can be rotated to produce a magnetic field pointing in different directions at the location of the magnetic sensor which directions extend parallel or orthogonally to each other.

The field intensity of the produced magnetic field is independent from temperature variations.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. Calibration tool for calibrating a magnetic sensor, comprising a cuboid-shaped housing; and
   either a predetermined number of two or four permanent magnets, wherein
      the two or four permanent magnets are arranged along an axis and positioned in the housing, and
      the two or four permanent magnets provide in a working volume a homogeneous magnetic field that has a constant field intensity,
   or a predetermined number of one or two permanent magnets, wherein
      each of the one or two permanent magnets is formed as a hollow cylinder having a first end, a second end opposite to the first end, and an outer lateral surface which encloses an empty inner space between the first end and the second end and which is penetrated by four holes, the first end of the hollow cylinder being an N pole and the second end of the hollow cylinder being an S pole, each of the four holes disposed at a location between the first end and the second end,
      each of the one or two permanent magnets is positioned in the housing, and
      the one or two permanent magnets provide in a working volume a homogeneous magnetic field that has a constant field intensity,
   or a number of permanent magnets arranged to form a Halbach array, wherein
      the permanent magnets are positioned in the housing, and
      the permanent magnets provide in a working volume a homogeneous magnetic field that has a constant field intensity;
   wherein
      the housing is configured to provide six alignment planes,
      the alignment planes extend either parallel or at an angle of 90° with respect to each other, and
      the housing has one or more holes allowing to position a magnetic sensor in the working volume.

2. Calibration tool according to claim 1, wherein the housing has six sidewalls and the six sidewalls form the six alignment planes.

3. Calibration tool according to claim 1, wherein
   the housing has six sidewalls,
   one or more of the sidewalls include one or more adjustable element protruding from the respective sidewall,
   the one or more adjustable elements of a sidewall define a corresponding one of the six alignment planes.

4. Calibration tool according to claim 1, wherein
   the housing has six sidewalls,
   one or more of the sidewalls include three screws screwed in the sidewall,
   one or more ends of the screws of a sidewall define a corresponding one of the six alignment planes.

5. Calibration tool for calibrating a magnetic sensor, comprising
   a cuboid-shaped housing; and
   a predetermined number of two permanent magnets;
   wherein
      the two permanent magnets have a flat shape,
      the two permanent magnets have a same magnetization direction,
      the two permanent magnets are arranged along an axis and positioned in the housing, and
      the two permanent magnets provide in a working volume a homogeneous magnetic field that has a constant field intensity,
   and wherein
      the housing is configured to provide six alignment planes, the alignment planes extend either parallel or at an angle of 90° with respect to each other, and the housing has one or more holes allowing to position a magnetic sensor in the working volume.

6. Calibration tool according to claim 5, wherein the housing has six sidewalls and the six sidewalls form the six alignment planes.

7. Calibration tool according to claim 5, wherein
the housing has six sidewalls,
one or more of the sidewalls include one or more adjustable element protruding from the respective sidewall,
the one or more adjustable elements of a sidewall define a corresponding one of the six alignment planes.

8. Calibration tool according to claim 5, wherein
the housing has six sidewalls,
one or more of the sidewalls include three screws screwed in the sidewall,
one or more ends of the screws of a sidewall define a corresponding one of the six alignment planes.

9. Calibration tool for calibrating a magnetic sensor, comprising
a cuboid-shaped housing; and
a predetermined number of four permanent magnets, the four permanent magnets being a first permanent magnet, a second permanent magnet, a third permanent magnet and a fourth permanent magnet;
wherein
the four permanent magnets have a flat shape,
the four permanent magnets are arranged along an axis and positioned in the housing,
the first permanent magnet and the second permanent magnet form a first pair of permanent magnets,
the third permanent magnet and the fourth permanent magnet are positioned outside the first pair of permanent magnets,
the first permanent magnet and the second permanent magnet have a same, first magnetization direction in order to provide in a working volume a homogeneous magnetic field that has a constant field intensity,
the third permanent magnet and the fourth permanent magnet have a same, second magnetization direction in order to provide in the working volume an additional homogeneous magnetic field that has a constant field intensity and points in a second direction,
the first permanent magnet and the second permanent magnet are made of a same material having a first temperature coefficient of the magnetic field,
the third permanent magnet and the fourth permanent magnet are made of a same material having a second temperature coefficient of the magnetic field which is different from the first temperature coefficient,
the first magnetization direction and the second magnetization direction are opposite to each other if the first and second temperature coefficient have the same sign and are the same if the first and second temperature coefficient have different signs,
the positions of the four permanent magnets along the axis are selected such that the temperature coefficient of the sum of the intensities of the magnetic field and the additional magnetic field in the working volume is zero,
and wherein
the housing is configured to provide six alignment planes,
the alignment planes extend either parallel or at an angle of 90° with respect to each other, and the housing has one or more holes allowing to position a magnetic sensor (22) in the working volume.

10. Calibration tool according to claim 9, wherein the housing has six sidewalls and the six sidewalls form the six alignment planes.

11. Calibration tool according to claim 9, wherein
the housing has six sidewalls,
one or more of the sidewalls include one or more adjustable element protruding from the respective sidewall,
the one or more adjustable elements of a sidewall define a corresponding one of the six alignment planes.

12. Calibration tool according to claim 9, wherein
the housing has six sidewalls,
one or more of the sidewalls include three screws screwed in the sidewall,
one or more ends of the screws of a sidewall define a corresponding one of the six alignment planes.

13. Calibration tool according to claim 9, wherein
each of the four permanent magnets has a center with a hole, and
the axis extends through the holes of the four permanent magnets.

14. Calibration tool according to claim 10, wherein
each of the four permanent magnets has a center with a hole, and
the axis extends through the holes of the four permanent magnets.

15. Calibration tool according to claim 9 wherein
the first magnetization direction runs parallel to a first of the alignment planes and orthogonal to a second and a third of the alignment planes.

16. Calibration tool according to claim 11, wherein
each of the four permanent magnets has a center with a hole, and
the axis extends through the holes of the four permanent magnets.

17. Calibration tool according to claim 10, wherein
the first magnetization direction runs parallel to a first of the alignment planes and orthogonal to a second and a third of the alignment planes.

18. Calibration tool according to claim 1, further comprising a reference member and a holder configured to hold the magnetic sensor, wherein the calibration tool, the reference member and the holder form a calibration setup, wherein the reference member includes a reference wall for aligning the calibration tool and wherein the holder is securable to the reference member in a fixed mechanical relationship.

19. Calibration tool according to claim 5, further comprising a reference member and a holder configured to hold the magnetic sensor, wherein the calibration tool, the reference member and the holder form a calibration setup, wherein the reference member includes a reference wall for aligning the calibration tool and wherein the holder is securable to the reference member in a fixed mechanical relationship.

20. Calibration tool according to claim 9, further comprising a reference member and a holder configured to hold the magnetic sensor, wherein the calibration tool, the reference member and the holder form a calibration setup, wherein the reference member includes a reference wall for aligning the calibration tool and wherein the holder is securable to the reference member in a fixed mechanical relationship.

* * * * *